United States Patent [19]

Corda

[11] Patent Number: 5,119,273
[45] Date of Patent: Jun. 2, 1992

[54] HIGH SPEED PARALLEL BACKPLANE

[75] Inventor: Albert J. Corda, Dahlgren, Va.

[73] Assignee: The United States of America as represented by the Secretary of the Navy, Washington, D.C.

[21] Appl. No.: 471,314

[22] Filed: Jan. 29, 1990

[51] Int. Cl.⁵ ............................................. H05K 7/20
[52] U.S. Cl. .................... 361/413; 361/412; 361/414; 361/424; 439/61; 439/65
[58] Field of Search ............... 361/393, 394, 396, 412, 361/414, 413, 424; 439/61, 65, 69, 74, 79

[56] References Cited

U.S. PATENT DOCUMENTS

| | | | |
|---|---|---|---|
| 3,495,134 | 2/1970 | Collins et al. | 361/393 |
| 3,833,840 | 9/1974 | Sinden | 361/394 X |
| 4,631,637 | 12/1986 | Romania et al. | 361/413 |
| 4,679,872 | 7/1987 | Coe | 439/61 |
| 4,700,274 | 10/1987 | Laut | 361/413 X |
| 4,734,825 | 3/1988 | Peterson | 361/394 X |
| 4,797,784 | 1/1989 | Belanger, Jr. | 361/415 X |
| 4,799,128 | 1/1989 | Chen | 361/414 |
| 4,800,383 | 1/1989 | Considine | 361/416 X |
| 4,802,062 | 1/1989 | Blum et al. | 361/414 X |
| 4,939,624 | 7/1990 | August et al. | 361/413 X |
| 4,973,799 | 11/1990 | Soma et al. | 361/414 X |
| 5,023,754 | 6/1991 | Aug et al. | 361/415 |
| 5,060,111 | 10/1991 | Takashima | 361/384 |

Primary Examiner—Leo P. Picard
Assistant Examiner—Paramita Ghosh
Attorney, Agent, or Firm—John D. Lewis; Kenneth E. Walden

[57] ABSTRACT

A cylindrical high speed parallel backplane for electrically inter-connecting a plurality of printed circuit boards in a data processing system. A plurality of cylindrical plate conductor structures are arranged parallel to one another. A plurality of circuit board connectors are disposed radially about the perimeter of the plate conductor structures to electrically connect the printed circuit board to the plate conductors structures. This cylindrical design of the backplane provides a short signal path length between the printed circuit boards connected to the backplane thereby providing for broad bandwidth capability.

3 Claims, 2 Drawing Sheets

HIGH SPEED PARALLEL BACKPLANE

ORIGIN OF THE INVENTION

The invention described herein was made in the performance of official duties by an employee of the Department Of the Navy and may be manufactured, used, licensed by or for the Government for any governmental purpose without payment of any royalties thereon.

BACKGROUND OF THE INVENTION

1. Field of the Invention

This invention relates to high speed data processing in particular to a high speed parallel backplane for interconnecting a plurality of printed circuit boards in a parallel processing system.

2. Description of the Prior Art

The conventional approach to parallel backplane design utilizes a set of circuit board connectors mounted on a flat supporting structure typically made of phenolic glass-epoxy. Common bus pins are interconnected via a set of linear metallized traces deposited on the supporting structure. Although this technique is acceptable for systems supporting low bandwidth applications, it begins to fail as the bus bandwidth exceeds 15 MHz. Of all the physical parameters which affect bus bandwidth, signal path length is the most crucial. According to the law of electromagnetics, when a signal path length approaches a quarter wavelength of operating frequency, radiative losses occur. This not only distorts the waveform present on the signal path, but also increases coupling between adjacent signal path elements, such as the linear traces on a conventional backplane. Thus, as the bus bandwidth increases, the linear parallel traces become inductively coupled and even begin to act as radiating elements thereby introducing cross-talk.

Current bus designs use a variety of mechanical shielding approaches and electrical termination schemes in an attempt to rectify the problem, but small changes in operating frequency and/or number of supported interconnects can often change the characteristic impedance of the system. Other conventional designs try to prevent the quarter wavelength effect by alternating signal and ground paths to shield the adjacent signal lines from one another. While these and other approaches have met with limited success, they all leave the basic problem of the quarter wavelength limit unsolved.

SUMMARY OF THE INVENTION

Accordingly, it is an object of the present invention to provide a parallel backplane capable of handling high speed data processing across a broad bus bandwidth.

It is a further object of the present invention to provide a parallel backplane that minimizes cross-talk between data signal paths.

Still another object of the present invention is to provide a parallel backplane whose physical construction is practical for various applications.

Other objects and advantages of this invention will become more apparent hereinafter in the specifications and drawings.

In accordance with the invention, a high speed parallel backplane has been designed to electrically interconnect a plurality of printed circuit boards in a high speed data processing system. A plurality of circular plate conductor structures are arranged parallel to one another forming a cylindrical topology. A plurality of circuit board connectors are disposed radially about the perimeter of the circular plate conductor structures. The circuit board connectors serve to electrically connect the printed circuit boards to the circular plate conductor structures. Each of the circular plate conductor structures is constructed of several layers of conductive and non-conductive material. Layers of conductive material are used for both signal path interconnects and for ground shielding between the signal path layers. Layers of non-conductive materials separate each of the layers of conductive material. This cylindrical topology minimizes signal path length thereby increasing the overall speed and bandwidth capabilities of the data processing system. Furthermore, the ground shielding layers virtually eliminate, capacitive cross-coupling between signal path layers. A related application entitled "Optical Highspeed Parallel Backplane was filed by Applicant on Jan. 29, 1990 disclosing an optical device using the circularly shaped, parallel structure herein disclosed.

DETAILED DESCRIPTION OF THE INVENTION

Figure 1:
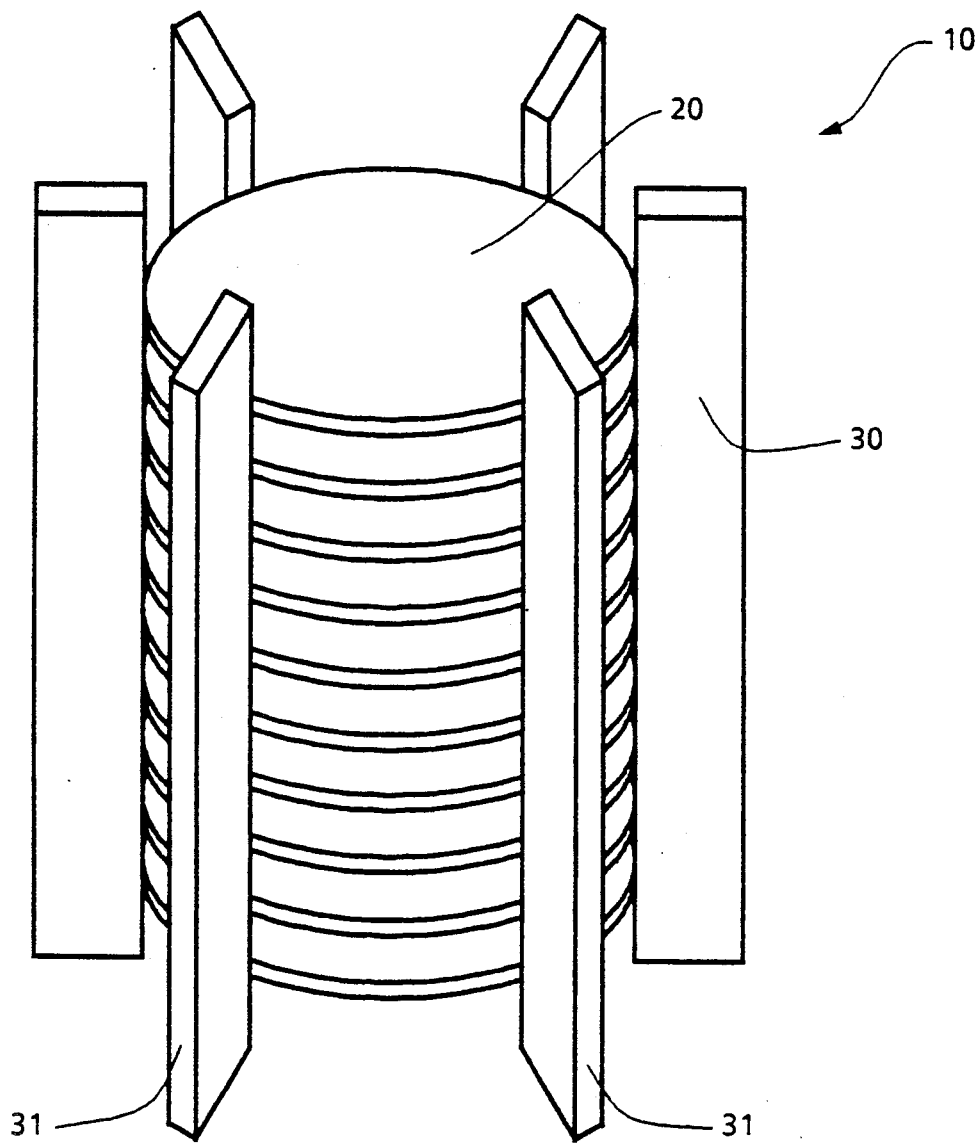
FIG. 1 is a perspective view of the preferred embodiment of the high speed parallel backplane according to the present invention.

Referring now to the drawings, and in particular to FIG. 1, the high speed parallel backplane 10 according to the present invention is shown. A series of circularly shaped, parallel conductor structures 20 are stacked to create a cylindrical set of parallel conductors. Circuit board connectors 30 are arranged radially around the perimeter of the plate conductor structures 20. Each of the circuit board connectors 30 is electrically connected to each of the plate conductor structures 20. Connective pads on printed circuit boards (not shown) are plugged into each of the connectors 30 at the front 31 of each connector thereby connecting the printed circuit boards to the plate conductor structures 20. The 6-card parallel backplane structure shown in FIG. 1 is for purposes of description only. The parallel backplane of the present invention may be designed for any number of circuit boards depending upon system requirements and limitations.

Figure 2:
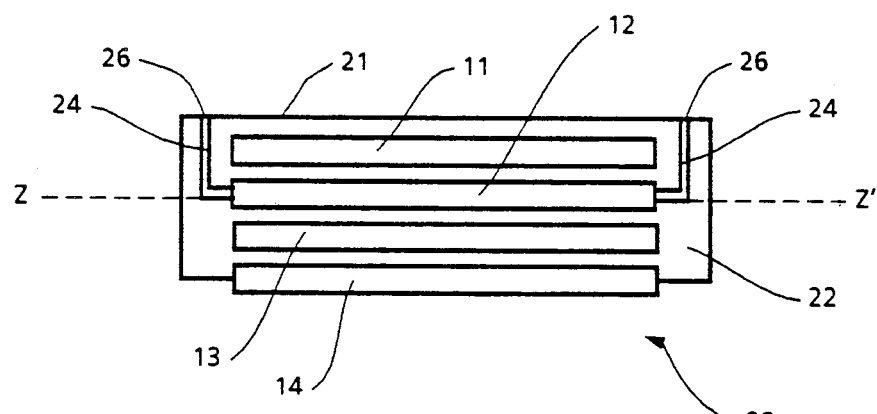
FIG. 2 is a cross-sectional view of the one of the conductor structures used in the present invention.

A cross-sectional view of one of the plate conductor structures 20 is shown in FIG. 2. For ease of description, a four conductive-layer structure will be described. However, the number of conductive layers used is merely a design consideration based upon system requirements and limitations. The basic principles of the present invention will be true in all design cases.

The four conductive layers 11, 12, 13 and 14 of structure 20 are separated from each other by a non-conductive material 22 such as fiberglass or any material having a low dielectric constant. The non-conductive material 22 minimizes the capacitance between conductive layers 11, 12, 13 and 14. Each of the conductive layers 11, 12, 13 and 14 is typically made from copper or any other suitable conductor. Conductive layers 11 and 13 are used as grounded shielding elements that completely isolate conductive layers 12 and 14. Accordingly, conductive layers 11 and 13 are solid plate layers. Layers 12 and 14 are used as parallel signal interconnects between the circuit board connectors 30. Thus, layers 12 and 14 provide signal paths between printed circuit boards plugged into the circuit board connectors 30. The overall thickness of plate conductor structure 20 is typically one millimeter. However, actual thickness may vary depending upon design considerations. The spacing between each of the structures 20 is typically designed around the circuit board connectors 30. The geometric shapes of layers 12 and 14 will be discussed further herein below.

Plated through holes 24 provide a conductive path from the surface 21 of plate conductor structure 20 to one of the conductive layers. Connective pads 26 provide the electrical connection point to the circuit board connectors 30. In FIG. 2, the plated through holes 24 are shown for signal path layer 12. Similar plated through holes are provided around the perimeter of each plate conductor structure 20 for each of the other layers 11, 13 and 14. Construction of this multi-layer design can be accomplished by using conventional printed circuit board fabrication techniques.

Figure 3:
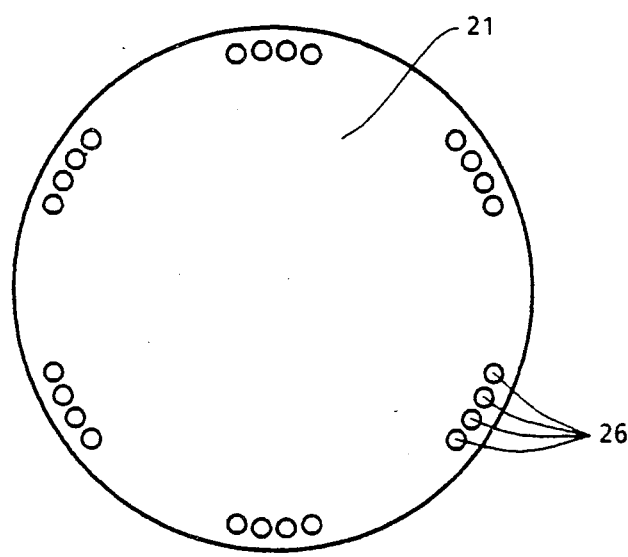
FIG. 3 is a top-view of the plate conductor structure.

In FIG. 3, a top-view of plate conductive structure 20 shows the connective pads 26 for the series of plated through holes 24. Thus, for the 6-card parallel backplane structure, there are 6 sets of four connective pads 26 on the surface 21 of each plate conductor structure 20. Each set of connective pads 26 is then connected to one of the circuit board connectors 30.

Figure 4:
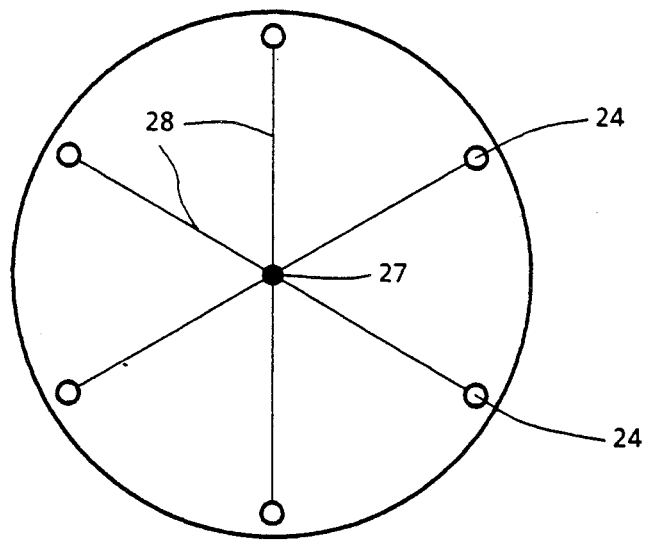
FIG. 4 is a top-view of the cut away along line Z—Z' of FIG. 2.

The geometric shapes of signal path layers 12 and 14 are designed based upon system requirements and limitations. In their simplest form, signal path layers 12 and 14 are solid plate layers. However, for high speed processing applications, layers 12 and 14 should have a reduced overall signal path surface area in order to reduce path and interplate capacitance. One such geometry is shown in FIG. 4 where signal path layer 12 is shown as a top-view cutaway along line Z—Z' of FIG. 2. Signal path layer 12 extends radially outward from its center 27 along signal paths 28. Paths 28 may vary in width depending on system impedance matching constraints and fabrication techniques. However, for purposes of description, paths 28 are nominally 1 mm wide. The symmetrical pinwheel geometry provides a reduced overall surface area of signal paths and assures equal signal path lengths for all of the printed circuit boards plugged into circuit board connectors 30. Since all path lengths are equal there are no impedance matching problems and the signal propagation delay between all circuit boards in the system is the same.

The radial geometry of the present invention provides the shortest possible signal path length between each of the printed circuit boards plugged into the connectors 30. Applying standard transmission line theory, it can easily be shown that the reduced signal path length increases the bus bandwidth by a factor of 10 over a conventional linear bus having the same amount of connectors.

Another advantage of the present invention is that as the number of circuit board connectors 30 increases, the signal path length increases at a slower rate than the conventional linear backplane. Adding a circuit board connector to a backplane design requires the maintenance of a minimal connector to connector spacing $\Delta L$.

In a conventional linear backplane, the performance of the backplane is linearly related to the overall length of the backplane. Thus, the performance of a conventional linear backplane is related to the incremental change in length $\Delta L$ of the signal path needed to allow the addition of the connector. However, in the cylindrical backplane of the present invention, the connector to connector $\Delta L$ spacing is at the perimeter of the conductor structure. Thus, the signal path length is only increased by a factor of $\Delta L/\pi$.

Still another advantage of the present invention is the reduction in cross-talk between signal paths. The plate conductor structures 20 utilize solid plate layers 11 and 13 as grounded shielding surfaces to isolate adjacent signal path layers 12 and 14. Grounded layers 11 and 13 provide efficient equipotential barriers because they are solid plate surfaces, rather than long thin parallel traces such as those used for shielding in linear backplanes.

Finally, the mechanical characteristics of the cylindrical parallel backplane also provide great physical utility. Since the printed circuit boards are arranged radially in the cylindrical bus structure, the whole system resembles a finned heat sink that provides for convective cooling. Furthermore, the radial geometry allows for high-profile components, such as relays and transformers, to be mounted on the outer portion of the printed circuit boards. The cylindrical parallel backplane architecture could further be modularized so that individual bus modules comprised of 10 plate conductor structures, for example, could be mounted one on top of another.

An alternative to the cylindrical backplane structure of the present invention might be an elliptical structure when design considerations call for impedance matching. In this way, signal path layout could be varied based on impedance matching requirements. Thus, although the invention has been described relative to specific embodiments thereof, it is not so limited and numerous variations and modifications thereof will be readily apparent to those skilled in the art in light of the above teaching. It is therefore to be understood that within the scope of the appended claims the invention may be practiced otherwise then as specifically described.

What is claimed is:

1. A high bandwidth parallel backplane for electrically interconnecting a plurality of printed circuit boards in a high speed parallel data processing system comprising:

a plurality of multi-layered, circularly shaped conductor disks arranged parallel to one another, each of said disks being constructed according to printed circuit board fabrication techniques, each of said disks further being of equal diameter and sharing a common axis perpendicular to each of said disks, wherein each of said multi-layered disks comprise a plurality of electrically conductive signal path layers, a plurality of shielding plate layers interleaved with said signal path layers for completely isolating each of said signal path layers, and . a plurality of electrically nonconductive material layers interleaved with and surrounding said signal path layers and said shielding plate layers, and wherein each of said multi-layered disks further includes electrically conductive paths that extend from each one of a corresponding signal path layer or corresponding shielding plate layer and pass through said electrically nonconductive material to electrically connect one of the corresponding signal path layer or corresponding shielding plate layer to corresponding connective pads on a surface of each of said disks; and a plurality of circuit board connectors disposed about the perimeter of and connectable to said disks via said connective pads for electrically connecting the printed circuit boards to said disks whereby signal path lengths are minimized.

2. A parallel backplane as in claim 1 wherein each of said shielding plate layers comprise a solid plate of electrically conductive material, said layer being further electrically connected to a ground potential.

3. A parallel backplane as in claim 1, each of said signal path layers having a plurality of common plane signal paths extending radially outward from the center of said signal path layer to a corresponding electrically conductive path, said common plane signal paths being further electrically connected at the center of said signal path layer.

* * * * *